(12) United States Patent
Hirata (10) Patent No.: US 7,243,425 B2
(45) Date of Patent: Jul. 17, 2007

(54) PRINTED WIRING BOARD AND METHOD OF MANUFACTURING THE SAME

(75) Inventor: Eiji Hirata, Isesaki (JP)

(73) Assignee: CMK Corporation, Tokyo (JP)

( * ) Notice: Subject to any disclaimer, the term of this patent is extended or adjusted under 35 U.S.C. 154(b) by 0 days.

(21) Appl. No.: 11/210,827

(22) Filed: Aug. 25, 2005

(65) Prior Publication Data

US 2006/0137906 A1    Jun. 29, 2006

(30) Foreign Application Priority Data

Dec. 24, 2004   (JP) .............................. 2004-373935

(51) Int. Cl.
*H01K 3/10* (2006.01)
(52) U.S. Cl. .................. 29/852; 29/825; 29/830; 29/840; 29/846
(58) Field of Classification Search ............... 29/846, 29/852, 825, 830, 840
See application file for complete search history.

(56) References Cited

U.S. PATENT DOCUMENTS

| | | | | |
|---|---|---|---|---|
| 6,107,003 | A * | 8/2000 | Kuwako ..................... | 430/314 |
| 6,373,026 | B1 * | 4/2002 | Kurosawa et al. ..... | 219/121.72 |
| 6,590,165 | B1 * | 7/2003 | Takada et al. ............... | 174/266 |
| 6,715,204 | B1 * | 4/2004 | Tsukada et al. ................ | 29/847 |
| 2002/0023778 | A1 | 2/2002 | Watanabe | |
| 2002/0083586 | A1 * | 7/2002 | Iijima et al. .................... | 29/847 |
| 2003/0150644 | A1 * | 8/2003 | Takada et al. ............... | 174/262 |
| 2006/0137906 | A1 | 6/2006 | Hirata | |
| 2006/0202344 | A1 * | 9/2006 | Takada et al. ............... | 257/758 |

FOREIGN PATENT DOCUMENTS

| | | | |
|---|---|---|---|
| EP | 0949855 A2 | * | 10/1999 |
| EP | 1102525 A1 | * | 5/2001 |
| JP | 10-322027 | * | 12/1998 |
| JP | 2000-31640 | * | 1/2000 |
| JP | 2002-26515 | | 1/2002 |
| JP | 2002-198653 | * | 7/2002 |
| JP | 2004-319994 | | 11/2004 |

OTHER PUBLICATIONS

U.S. Appl. No. 11/452,321, filed Jun. 14, 2006, Hirata.

* cited by examiner

*Primary Examiner*—Carl J. Arbes
(74) *Attorney, Agent, or Firm*—Oblon, Spivak, McClelland, Maier & Neustadt, P.C.

(57) ABSTRACT

The present invention provides a printed wiring board in which there is no positional deviation between a blind via hole and a land and which enables high-density wiring design to be easily achieved. Provided is a method of manufacturing a printed wiring board in which wiring pattern forming layers are connected by a blind via hole, which includes the steps of forming a wiring pattern by etching at least metal foil laminated on a surface of an insulating layer and forming a land having a window portion in a portion where a blind via hole is to be formed; irradiating the window portion with a laser beam having a diameter larger than the diameter of the window portion but smaller than the diameter of the land, thereby making a nonthrough hole for forming the blind via hole; and forming a blind via hole by forming a plating on the nonthrough hole and the land.

4 Claims, 7 Drawing Sheets

PRINTED WIRING BOARD AND METHOD OF MANUFACTURING THE SAME

BACKGROUND OF THE INVENTION

1. Field of the Invention

The present invention relates to a printed wiring board and a method of manufacturing the printed wiring board and, more particularly, to a printed wiring board having a fine wiring pattern of high-density wiring design and a method of manufacturing the printed wiring board.

2. Description of the Related Art

Methods of forming a circuit in a printed wiring board are divided into the subtractive method which involves forming an etching resist pattern on metal foil, such as copper foil, and forming a wiring pattern by etching the part of metal foil not covered by the etching resist pattern; and the additive method which involves forming a plating resist of a pattern reverse to a circuit and forming a wiring circuit by depositing a plating on an opening of this plating resist.

Because the manufacturing steps in the subtractive method are easier than in the additive method, it is possible to manufacture circuits at very low cost. However, in the plating and an electrolytic plating to the whole insulating substrate when forming through-holes and blind-via-holes etc. and, therefore, the thickness of the conductor layer (metal foil plus a plating) to be etched becomes very large. Therefore, it was difficult to form a good circuit. Particularly, the subtractive method was not suitable for the formation of a fine wiring pattern having pattern line/pattern space of not more than 75 μm/75 μm.

In contrast, the additive method, which is favorable for the formation of a fine wiring pattern, requires that a wiring pattern be formed by depositing a plating on an insulating layer and, therefore, compared to a case as in the subtractive method where an insulating substrate in which metal foil has been laminated on an insulating layer is processed, the additive method had problems such that the adhesion of the wiring pattern is poor.

Furthermore, in terms of the design of printed wiring patterns, wiring patterns are formed nonuniformly in the plane of the substrate and, therefore, when wiring patterns are formed by selective plating as in the additive method, currents are concentrated more than necessary in portions of coarse wiring patterns and variations in the thickness of the wiring pattern become large, resulting in problems such that it is difficult to ensure impedance matching.

Figure 6:
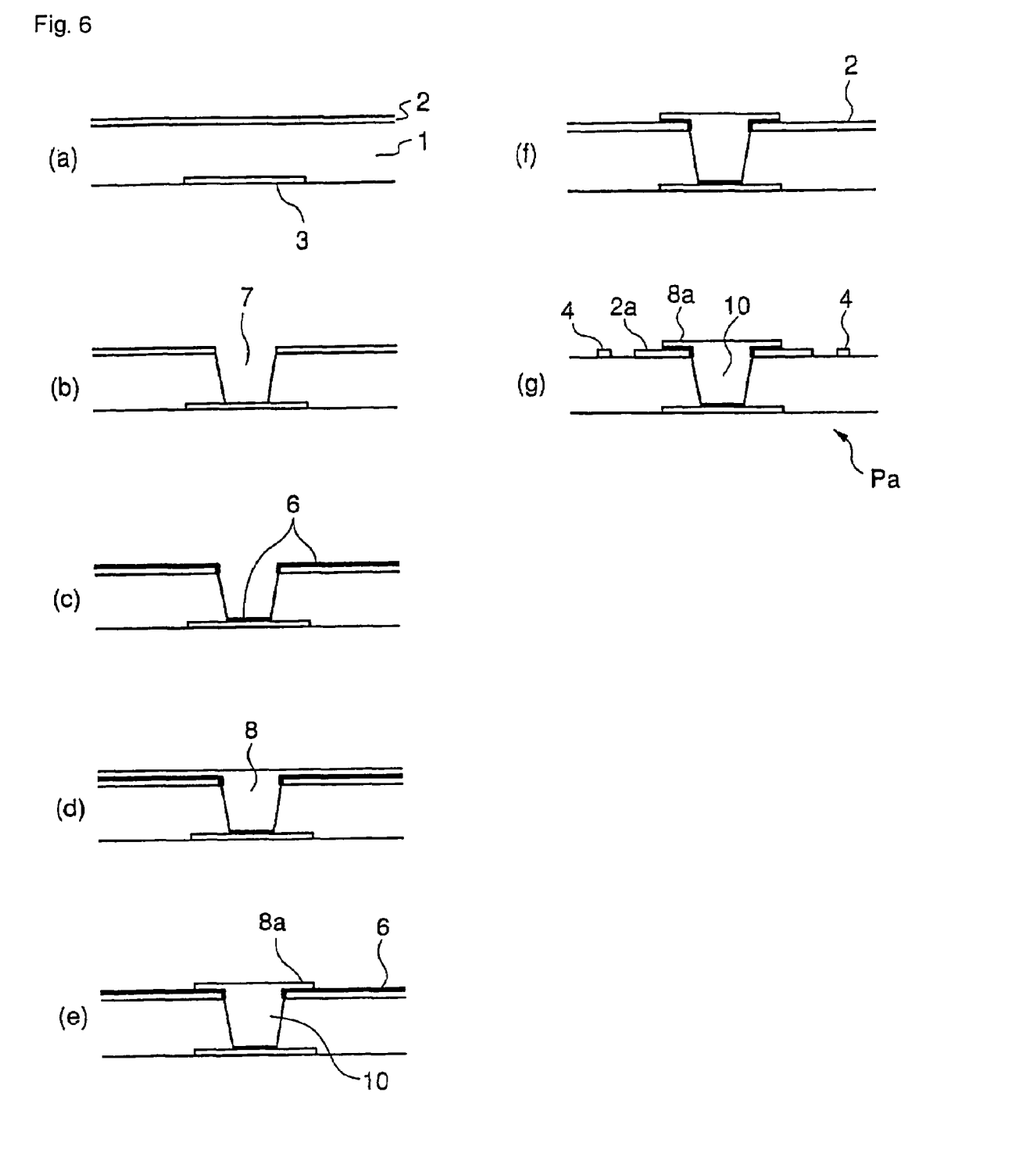
FIGS. 6(a) to 6(g) are each a schematic sectional diagram of steps to explain a conventional manufacturing process of a printed wiring board.

To solve such problems, the present inventors have invented a method of manufacturing a printed wiring board of a construction as shown in FIGS. 6(a) to 6(c) (FIGS. 6(a) to 6(c) show a condition without a positional deviation in the laser beam machining and exposure steps), and the patent application of this invention has already been released to the public (refer to JP-A-2004-319994).

FIGS. 6(a) to 6(c) show an example in which buildup wiring layers are formed on an inner-layer core substrate, which is not shown. First, as shown in FIG. 6(a), an insulating layer 1 and metal foil 2, such as copper foil, are laminated in this order on a layer on which a lower-layer wiring pattern 3 is formed, which is formed in an inner layer (for example, resin-including copper foil is laminated). Subsequently, a nonthrough hole 7 which reaches the lower-layer wiring pattern 3 is made by laser irradiation (refer to FIG. 6(b)).

Next, after desmear treatment of the nonthrough hole 7 is performed, as shown in FIG. 6(c), a barrier metal layer 6 (for example, Ni—B and Ni—P) is formed by substitutional nonelectrolytic plating treatment on the area of the surface of the lower-layer wiring pattern 3 uncovered by the metal foil 2 and the nonthrough hole 7.

Next, a nonelectrolytic plating (for example, a nonelectrolytic copper plating), which is not shown, was formed on the whole area of an outer layer including the nonthrough hole 7. Subsequently, by performing electrolytic plating treatment (for example, electrolytic copper plating treatment using a plating liquid for filled vias), a plating 8 is filled in the nonthrough hole 7 and the plating 8 is deposited also on the outer layer (refer to FIG. 6(d)).

Next, as shown in FIG. 6(e), after the pattern formation of a blind via hole 10 and its land portion (hereinafter referred to as a "plating land 8a,"), as shown in FIG. 6(f), the barrier metal layer 6 exposed to the outer layer is removed by etching and subsequently, circuit is formed on the exposed metal foil 2, whereby a printed wiring board Pa of FIG. 6(g), on the outer layer of which an upper-layer wiring pattern 4 is formed is obtained.

Because a plating is deposited also on the outer layer when a plating is filled in a blind via hole as described above, compared to a case where a plating is deposited only in the formation portion of blind via hole, the blind via hole can be filled with the plating in a more stable manner (and it is possible to eliminate variations in the amount of deposited plating caused by either coarse or dense condition of the area on which the plating is deposited) and by forming the wiring pattern by etching the metal foil which has been laminated on an insulating layer, it is also possible to ensure the adhesion of the wiring pattern to the insulating layer. Furthermore, it is possible to keep the thickness constant because the metal foil is protected by the barrier metal layer and, therefore, a fine wiring pattern (equivalent to the upper-layer wiring pattern 4 in the figure) can be easily formed.

However, in the above-described construction, processing involves three steps in total, i.e., laser beam machining when the nonthrough hole 7 is made, and the exposure steps in the formation of the plating land 8a and the metal foil land 2a (the outermost land obtained by performing the circuit formation of the metal foil 2 shown in FIG. 6(g)). Therefore, when all alignment accuracy is considered, the land diameter (equivalent to the above-described metal foil land 2a) becomes considerably large, thereby impairing high-density wiring design (this applies also to a manufacturing method which involves etching a window portion for laser beam machining in metal foil beforehand and then making a nonthrough hole).

Simply, because laser beam machining is performed directly from above the metal foil 2, in terms of the machining accuracy of a laser beam machine, a positional deviation occurs in the range of about 20 μm one side (40 μm in diameter) or so from the reference point and, therefore, in a case where the plating land 8a is formed by etching the plating 8 later, it is necessary to consider the above-described amount of positional deviation.

Figure 7:
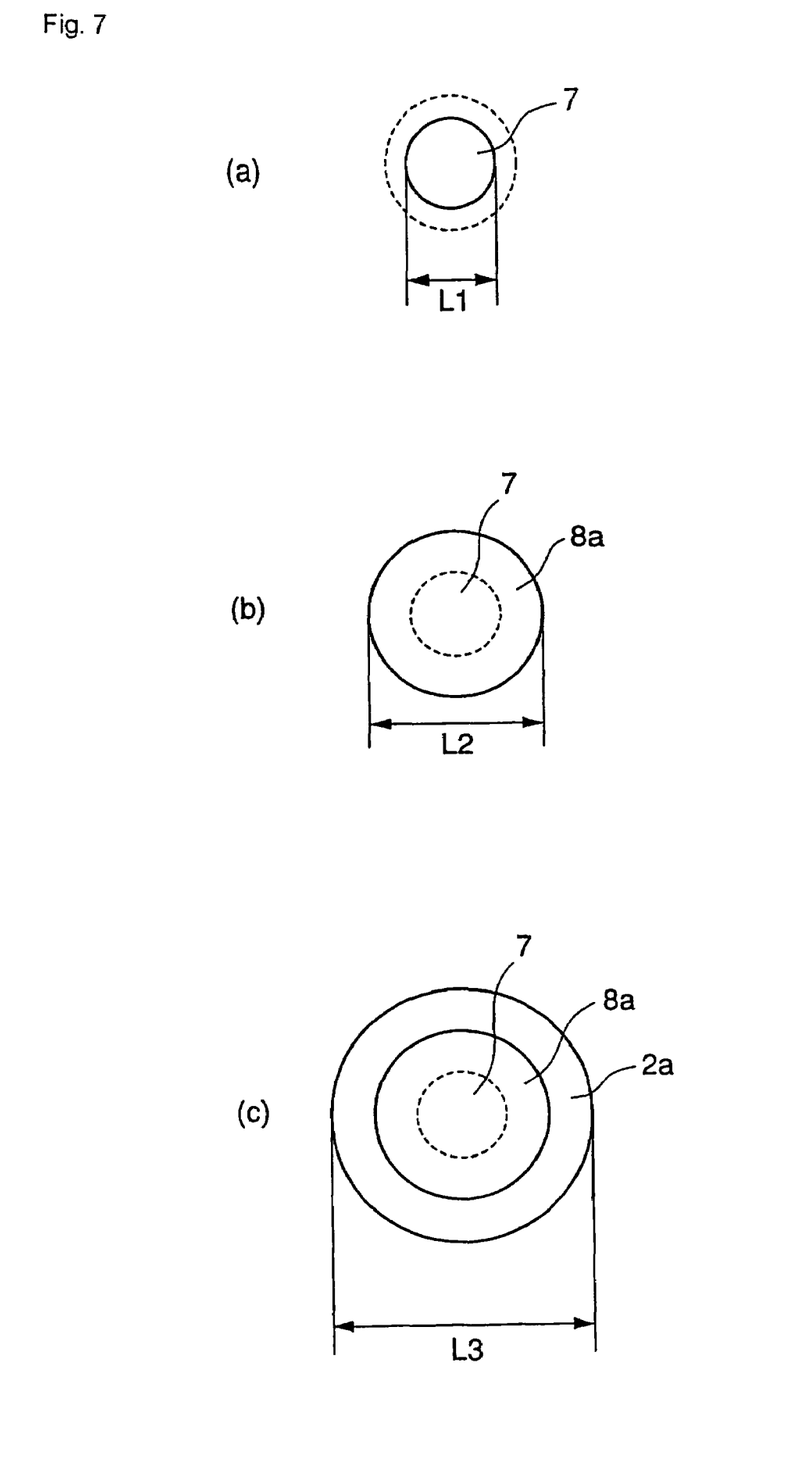
FIGS. 7(a) to 7(c) are each a schematic plan view to explain the size of a land diameter formed in FIGS. 6(a) to 6(g).

More specifically, FIG. 7(a) is a plan view which shows the nonthrough hole 7 made in the step of FIG. 6(b) as viewed from above and if it is supposed that the nonthrough hole 7 is in the reference position, then it follows that a positional deviation occurs in the range indicated by a dotted line (in the range in which the diameter is 40 μm larger than the diameter L1 of the nonthrough hole 7).

Therefore, in order to form the plating land 8a so that the nonthrough hole 7 does not run off the plating land 8a, when the exposure accuracy during the formation of an etching resist pattern, which is not shown, (for example, a positional deviation in the range of about 20 μm one side (40 μm in diameter) from the reference point) is also considered, as shown in FIG. 7(b) (a plan view obtained when FIG. 6(e) is viewed from above), it is necessary to form the plating land 8a with a diameter L2 which is larger than the diameter of the nonthrough hole 7 by 40 μm one side (diameter 80 μm) and hence it was necessary to set the diameter L3 of the outermost metal foil land 2a at a very large value. Incidentally, FIG. 7(c) (a plan view obtained when FIG. 6(g) is viewed from above) shows a case where the plating land 8a is formed so that the plating land 8a does not run off the metal foil land 2a and also in this case, the exposure accuracy must be considered. Therefore, the diameter L3 of the metal foil land 2a becomes larger than the diameter of the nonthrough hole 7 by 80 μm one side (160 μm in diameter).

The present invention has been made to solve the above problem and has as its object the provision of a printed wiring board having a fine wiring pattern in which high-density wiring design is aimed at by eliminating a positional deviation between a blind via hole and a land, and a method of manufacturing this printed wiring board.

SUMMARY OF THE INVENTION

To achieve the above object, a first embodiment of the present invention provides a printed wiring board having wiring pattern forming layers which are connected by a blind via hole, in which the blind via hole is formed without a positional deviation from an upper-layer-side wiring pattern connected to this blind via hole.

By thus eliminating a positional deviation between a blind via hole and a wiring pattern (concretely, a land formed around a blind via hole), it is possible to reduce the diameter of the land, with the result that high-density wiring design can be achieved.

To achieve the above object a second embodiment of the present invention provides the printed wiring board described in the first embodiment, in which a hole for forming the blind via hole is formed by laser beam machining by use of a land having a window portion provided during the formation of the upper-layer-side wiring pattern as a mask.

As a result of this, it is possible to obtain a printed wiring board having no positional deviation between a land and a blind via hole.

To achieve the above object, a third embodiment of the present invention provides the printed wiring board described in the second embodiment, in which a plating during the formation of other via holes including the blind via hole is formed only within a hole made during the formation of the blind via hole and the other via holes, and on a land surrounding the peripheral edge of the hole.

As a result of this, it is possible to achieve high-density design of a printed wiring board having a fine wiring pattern.

To achieve the above object, a fourth embodiment of the present invention provides the printed wiring board described in the second embodiment, in which the plating during the formation of the other via holes including the blind via hole is formed also on wiring patterns other than a fine wiring pattern.

As a result of this, compared to a case where a plating is deposited only on the formation portion of a blind via hole etc., a plating deposits in the hole portion of the blind via hole etc. in a more stable manner. Therefore, it is possible to ensure that the blind via hole is highly reliable.

To achieve the above object, a fifth embodiment of the present invention provides a method of manufacturing a printed wiring board in which wiring pattern forming layers are connected by a blind via hole, and includes forming a wiring pattern by etching at least metal foil laminated on a surface of an insulating layer and forming a land having a window portion in a portion where a blind via hole is to be formed; irradiating the window portion with a laser beam having a diameter larger than the diameter of the window portion but smaller than the diameter of the land, thereby making a nonthrough hole for forming the blind via hole; and forming a blind via hole by forming a plating on the nonthrough hole and the land.

As a result of this, it is possible to achieve high-density design of a printed wiring board having a fine wiring pattern.

To achieve the above object, as described in claim 6, a sixth embodiment of the present invention provides the method of manufacturing a printed wiring board according to the fifth embodiment, in which the method has, after the step of forming a wiring pattern, the step of depositing a nonelectrolytic plating at least in a portion where the wiring pattern is not formed.

As a result of this, in the desmear treatment performed after the making of a nonthrough hole, the insulating layer is exposed only in the part of the nonthrough hole and, therefore, the deterioration of a desmear treatment liquid bath can be suppressed and it can be ensured that the lifetime of the liquid is comparable to that of ordinary usage. Furthermore, because the insulating layer present at the bottom of a wiring pattern does not dissolve during the desmear treatment, the apprehension that liquids of soft etching, which is performed in a preceding step, and the like might flow in under the bottom surface of the wiring pattern, causing the thinning of the wiring pattern.

To achieve the above object, a seventh embodiment of the present invention provides the method of manufacturing a printed wiring board according to the fifth or sixth embodiment, in which the plating during the formation of a blind via hole is deposited also on wiring patterns other than a fine wiring pattern.

As a result of this, the area in which the plating is deposited becomes wide and, therefore, it becomes possible that the plating is deposited easily also within the nonthrough hole.

To achieve the above object, an eighth embodiment of the present invention provides the method of manufacturing a printed wiring board according to the fifth embodiment, in which after the formation of a wiring pattern, a barrier metal layer which accompanies etching conditions different from those employed during the formation of the blind via hole is formed at least on a front side surface of the wiring pattern.

As a result of this, it is possible to easily achieve high-density design of a printed wiring board having a fine wiring pattern.

Because a printed wiring board having a blind via hole is a constituent feature of the present invention, no positional deviation occurs between a blind via hole and a land. As a result, it is possible to reduce the diameter of the land, making it possible to easily achieve high-density wiring design.

DETAILED DESCRIPTION OF THE PREFERRED EMBODIMENTS

The first embodiment of the present invention will be described below by using FIG. 1(e).

Figure 1:
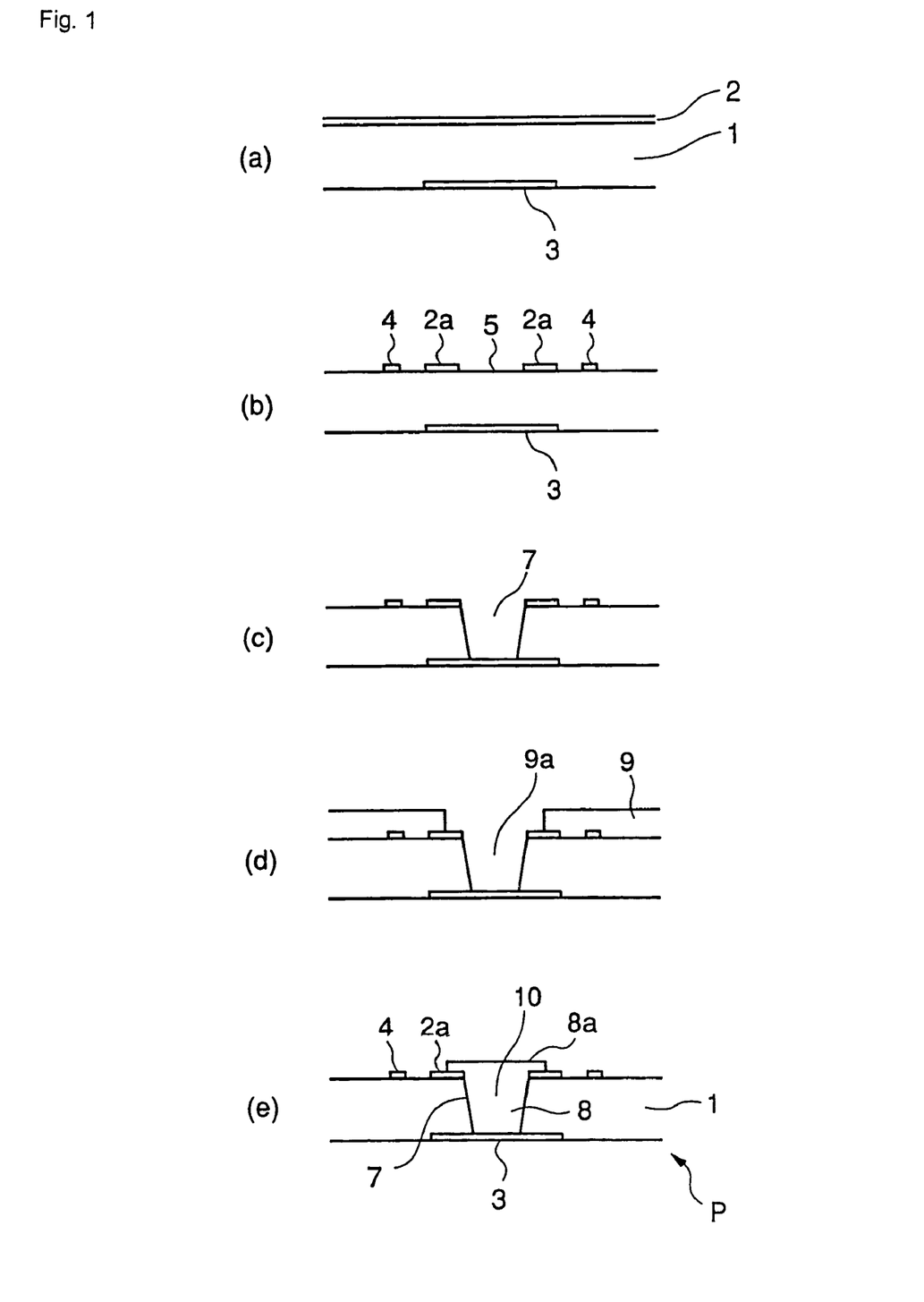
FIGS. 1(a) to 1(e) are each a schematic sectional diagram of steps to explain the first embodiment of the present invention.

FIG. 1(e) is a partially enlarged sectional view of a printed wiring board P in which a buildup wiring layer is laminated on an inner-layer core substrate, which is not shown. The printed wiring board P is constituted by a lower-layer wiring pattern 3 formed on the inner-layer core substrate, an insulating layer 1 laminated on a forming layer of the lower-layer wiring pattern 3, an upper-layer wiring pattern 4 formed on the surface of the insulating layer 1, a metal foil land 2a formed with such a diameter that a plating land 8a does not run off the metal foil land 2a during the later circuit formation of the plating land 8a, a nonthrough hole 7 made by using a window portion 5 of the metal foil land 2a as a mask, a blind via hole 10 in which the nonthrough hole 7 is filled with a plating 8, and a plating land 8a formed from the plating 8 in such a manner as to overlap a part of the metal foil land 2a. By eliminating a positional deviation between the metal foil land 2a and the blind via hole 10, the diameters of the plating land 8a and metal foil land 2a are reduced, thereby achieving high-density wiring design.

Next, a method of manufacturing the printed wiring board P of FIG. 1(e) will be described.

First, as shown in FIG. 1(a), an insulating layer 1 and metal foil 2, such as copper foil, are laminated in this order on a layer on which a lower-layer wiring pattern 3 is formed, which is formed in an inner layer (for example, resin-including copper foil is laminated). Subsequently, as shown in FIG. 1(b), an upper-layer wiring pattern 4 is formed by etching treatment and a metal foil land 2a having a window portion 5 is formed.

Because the window portion 5 and the metal foil land 2a are formed in the same exposure step, no positional deviation occurs between the two. Therefore, it is only necessary that the diameter L3 of the metal foil land 2a be set by considering the exposure accuracy during the formation of a plating land 8a to be formed later (refer to the plan view of FIG. 2(a)). For example, if it is supposed that a positional deviation occurs in the range of 20 μm one side (40 μm in diameter) from the reference point, it is possible to form the metal foil land 2a with an diameter obtained by adding 40 μm one side (80 μm in diameter) to the outside diameter L1 of the window portion 5.

Next, after the deposition of a nonelectrolytic plating (for example, a nonelectrolytic copper plating) on the whole area of the outer layer, a nonthrough hole 7 which reaches the lower-wiring pattern 3 is formed (refer to FIG. 1(c)) by performing irradiation with a laser beam having a diameter larger than the diameter of the window portion 5 and smaller than the diameter of the metal foil land 2a by use of the metal foil land 2a as a mask for laser beam machining.

Because the window portion 5 and the metal foil land 2a are formed in the same exposure step as described above, no positional deviation occurs between the two. Therefore, also the nonthrough hole 7, which is formed by irradiation with a laser beam having a diameter larger than the diameter L1 of the window portion 5 but smaller than the diameter L3 of the metal foil land 2a, is inevitably formed without a positional deviation.

Although this embodiment has been described by using an example in which a nonelectrolytic plating is deposited on the whole area of the outer layer before laser beam machining, it is not always necessary that the nonelectrolytic plating be formed. However, from the standpoint of suppressing the deterioration of a bath of desmear treatment, which is performed later, and preventing the thinning of a wiring pattern ascribable to the desmear treatment, it is desirable to form the nonelectrolytic plating and to reduce the area of the insulating layer exposed to the surface. Furthermore, it is not always necessary that the nonelectrolytic plating be formed on the whole area of the outer layer and it is only necessary that the nonelectrolytic plating be formed at least in a portion where the wiring pattern is not formed (on the part of insulating layer not covered by the wiring pattern).

Next, after the desmear treatment is performed, a nonelectrolytic plating (for example, a nonelectrolytic copper plating), which is not shown, is deposited on the surface of the substrate in the condition shown in FIG. 1(c). Subsequently, after the lamination of a plating resist, a plating resist pattern 9 having an opening 9a from which the nonthrough hole 7 and a part of the metal foil land 2a are exposed is formed (the diameter L2a of the opening 9a of the plating resist pattern 9 is such that the above-described exposure accuracy is taken into consideration, and for instance, in the case of the above-described example, the diameter L2a can be set by adding 40 μm in diameter to the diameter L1 of the window portion 5 (refer to the plain view of FIG. 2(b))).

Figure 2:
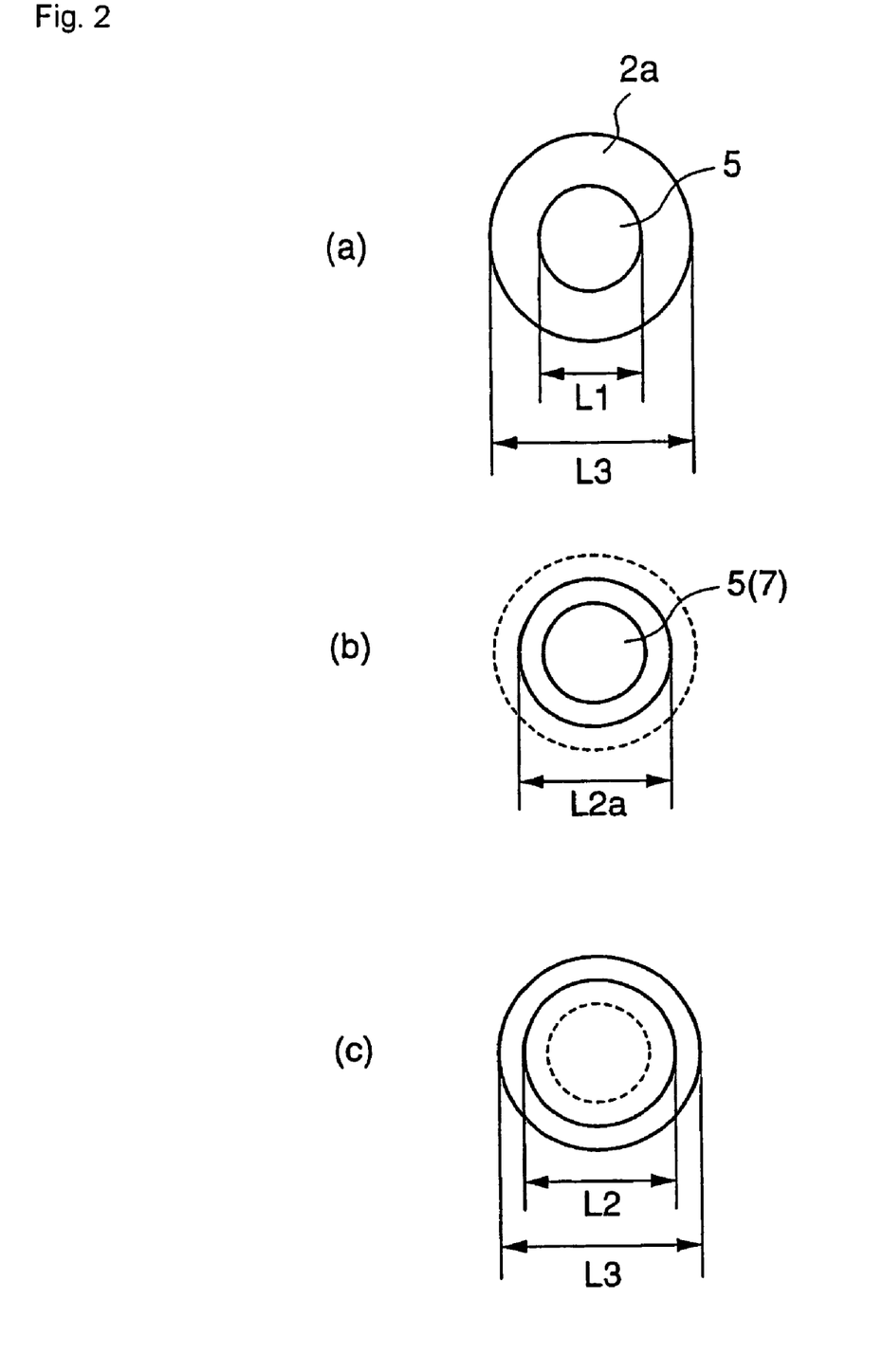
FIGS. 2(a) to 2(c) are each a schematic plan view to explain the size of a land diameter formed in FIGS. 1(a) to 1(e)

Next, by performing electrolytic plating treatment (for example, electrolytic copper plating using a plating liquid for filled vias) using the nonelectrolytic plating as a power supply layer, a plating 8 is filled in the nonthrough hole 7 exposed from the opening 9a of the plating resist pattern 9, and the plating 8 is deposited in such a manner as to overlap part of the metal foil land 2a and subsequent to the exfoliation of the plating resist pattern 9, the nonelectrolytic plating exposed to the surface, which is not shown, is removed by etching, whereby the printed wiring board P of FIG. 1(e) in which the lower-layer wiring pattern 3 and the upper-layer wiring pattern 4 is connected by the blind via hole 10 is obtained (the printed wiring board P is formed in which the diameter L2 of the plating land 8a is set by adding 40 μm to diameter of the diameter L1 of the window portion 5 (refer to FIG. 2(c)).

In this manner, because the circuit formation of the metal foil is performed beforehand and a plating in the formation of a blind via hole is formed only in a portion where the blind via hole is to be formed (when there is a full through hole, this portion includes also a portion where the full through hole is to be formed), a fine wiring pattern can be easily formed and furthermore, because a nonthrough hole in the formation of the blind via hole is made by performing laser beam machining using the metal foil land formed in the above-described circuit formation as a mask, the blind via hole and the metal foil land can be formed without a positional deviation. As a result, it is possible to reduce the diameter of a land (concretely, a metal foil land) formed around the blind via hole compared to conventional cases, thereby making it possible to achieve high-density wiring design.

Although this embodiment has been described by using an example in which a plating in the formation of a blind via hole is formed only in a portion where the blind via hole is to be formed (when there is a through hole, this portion also includes a portion where the through hole is to be formed), to form the plating also on wiring patterns other than a fine wiring pattern is desirable for stable deposition of the plating in a portion where the blind via hole is to be formed (when there is a through hole, this portion also includes a portion where the through hole is to be formed).

Figure 3:
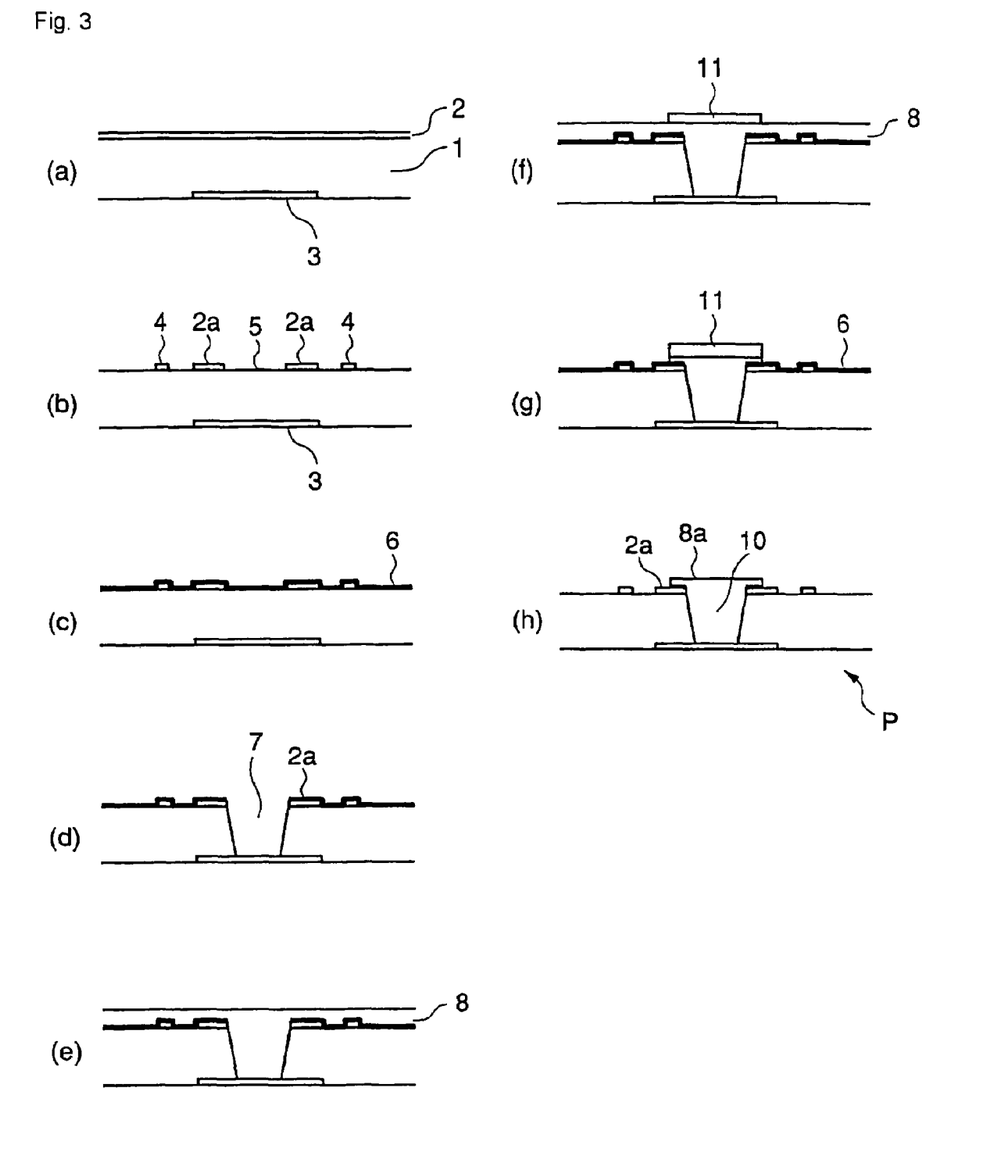
FIGS. 3(a) to 3(h) are each a schematic sectional diagram of steps to explain the second embodiment of the present invention.

Next, the second embodiment of the present invention will be described by using FIGS. 3(a) to 3(h). Incidentally, for the description about the construction of a printed wiring board P (refer to FIG. 3(h)), is omitted because the construction is the same as that in the printed wiring board P obtained in FIG. 1(e), with the exception that a barrier metal layer 6 remains in a portion where a plating land 8a and a metal foil land 2a overlap with each other, and only the manufacturing process is described. The manufacturing process of FIGS. 3(a) to 3(h) shows an example in which as with the example shown in FIGS. 1(a) to 1(e) above, buildup wiring layers are formed on an inner-layer core substrate, which is not shown. Because FIGS. 3(a) and 3(b) show the same steps as FIGS. 1(a) and 1(b) above, their descriptions are omitted and descriptions of FIGS. 3(c) to 3(h) are described.

After the formation of an upper-layer wiring pattern 4 of FIG. 3(b) (including also a metal foil land 2a), a barrier metal layer 6 made from a thin metal film under etching conditions different from etching conditions during the later formation of a blind via hole is formed on the whole surface of an outer layer including the upper-layer wiring pattern 4 (including also a metal foil land 2a) (refer to FIG. 3(c)).

In the barrier metal layer 6, any metal may be used so long as the upper-layer wiring pattern 4 is not etched during the later circuit formation of a blind via hole portion. For example, Ni, Sn, Ag, etc. by nonelectrolytic plating treatment can be enumerated.

It is desirable in terms of the manufacturing process that the barrier metal layer 6 be selected in consideration of exfoliatability. In the case of Ni, for example, exfoliation is easy with Ni and an Ni—B plating, whereas exfoliation becomes difficult when the phosphorus content is high with an Ni—P plating. Therefore, in this case low-phosphorus metals of not more than 3% P are desirable.

Next, as shown in FIG. 3(d), a nonthrough hole 7 which reaches the lower-layer wiring pattern 3 is formed by performing irradiation with a laser beam having a diameter larger than the diameter of the window portion 5 but smaller than the diameter of the metal foil land 2a by use of the metal foil land 2a as a mask for laser beam machining.

Next, after the desmear treatment of the nonthrough hole 7 is performed, a nonelectrolytic plating (for example, a nonelectrolytic copper plating), which is not shown, is formed on the whole area of the outer layer including the nonthrough hole 7. Subsequently, by performing electrolytic plating treatment (for example, electrolytic copper plating using a plating liquid for filled vias) using the nonelectrolytic plating as a power supply layer, a plating 8 is filled in the nonthrough hole 7 and the plating 8 is deposited also on the outer layer (refer to FIG. 3(e)).

Next, as shown in FIG. 3(f), after the formation of an etching resist pattern 11 in a portion where the blind via pattern 10 and its land portion (the later plating land 8a) are to be formed, by performing etching treatment, the plating 8 exposed from the etching resist pattern 11 (including also a nonelectrolytic plating, which is not shown) is removed (refer to FIG. 3(g)).

And finally, after the exfoliation of the etching resist pattern 11, the barrier metal layer 6 exposed to the surface is removed by etching, whereby a printed wiring board P of FIG. 3(h) is obtained.

Also in this embodiment, the same effect as in the above-described first embodiment is obtained. However, because blind via hole formation is performed by using the barrier metal layer (an electrolytic plating is deposited on the whole area of the outer layer including a nonthrough hole), a plating can be easily deposited within a nonthrough hole compared to a case where as in the above-described first embodiment, an electrolytic plating is deposited only in a portion where a blind via hole is formed (when there is a full through hole, this portion includes also a portion where the full through hole is to be formed).

Subsequently, the third embodiment of the present invention will be described by using FIGS. 4(a) to 4(h). Incidentally, also in this embodiment, the steps shown in FIGS. 4(a) and 4(b) are the same as in the first and second embodiments and, therefore, their descriptions are omitted.

After the formation of an upper-layer wiring pattern 4 of FIG. 4(b) (including also a metal foil land 2a), a barrier metal layer 6 made from a thin metal film under etching conditions different from etching conditions during the later formation of a blind via hole is formed on the front side surface of the upper-layer wiring pattern 4 (including also a metal foil land 2a) (refer to FIG. 4(c)).

Figure 4:
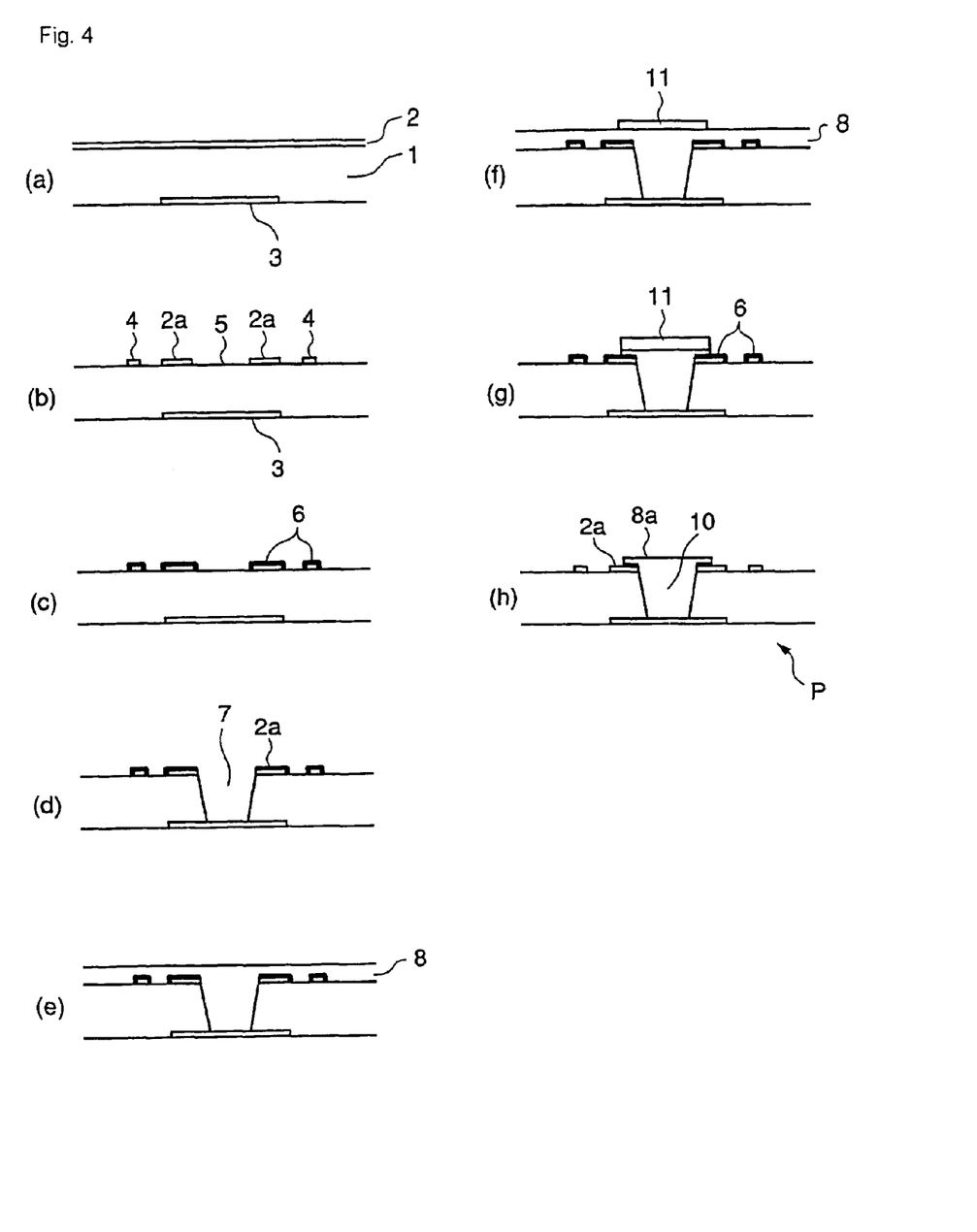
FIGS. 4(a) to 4(h) are each a schematic sectional diagram of steps to explain the third embodiment of the present invention.

Next, as shown in FIG. 4(d), a nonthrough hole 7 which reaches the lower-layer wiring pattern 3 is formed by performing irradiation with a laser beam having a diameter larger than the diameter of the window portion 5 but smaller than the diameter of the metal foil land 2a by use of the metal foil land 2a as a mask for laser beam machining.

Next, after the desmear treatment of the inside of the nonthrough hole 7 is performed, a nonelectrolytic plating (for example, a nonelectrolytic copper plating), which is not shown, is formed on the whole area of the outer layer including the nonthrough hole 7. Subsequently, by performing electrolytic plating treatment (for example, electrolytic copper plating using a plating liquid for filled vias) using the nonelectrolytic plating as a power supply layer, a plating 8 is filled in the nonthrough hole 7 and the plating 8 is deposited also on the outer layer (refer to FIG. 4(e)).

Next, as shown in FIG. 4(f), after the formation of an etching resist pattern 11 in a portion where the blind via pattern 10 and its land portion (the later plating land 8a) are to be formed, by performing etching treatment, the plating 8 exposed from the etching resist pattern 11 (including also a nonelectrolytic plating, which is not shown) is removed (refer to FIG. 4(g)).

And finally, after the exfoliation of the etching resist pattern 11, the barrier metal layer 6 exposed to the surface is removed by etching, whereby a printed wiring board P of FIG. 4(h) is obtained.

In this embodiment, the barrier metal layer provided in the whole area of the outer layer in the above-described second embodiment is provided only on the front side surface of the wiring pattern, and this embodiment is the same as the second embodiment in other respects. However, because in this construction, the desmear treatment of the nonthrough hole is performed, with the insulating layer exposed to a portion where the upper-layer wiring pattern is not formed, it is necessary to select a material for the insulating layer which hardly dissolves during the desmear treatment.

Subsequently, the fourth embodiment will be described by using FIGS. 5(a) to 5(h). Incidentally, also in this embodiment, the steps 5(a) and 5(b) are the same as in the above-described first to third embodiments and, therefore, their description are omitted.

Figure 5:
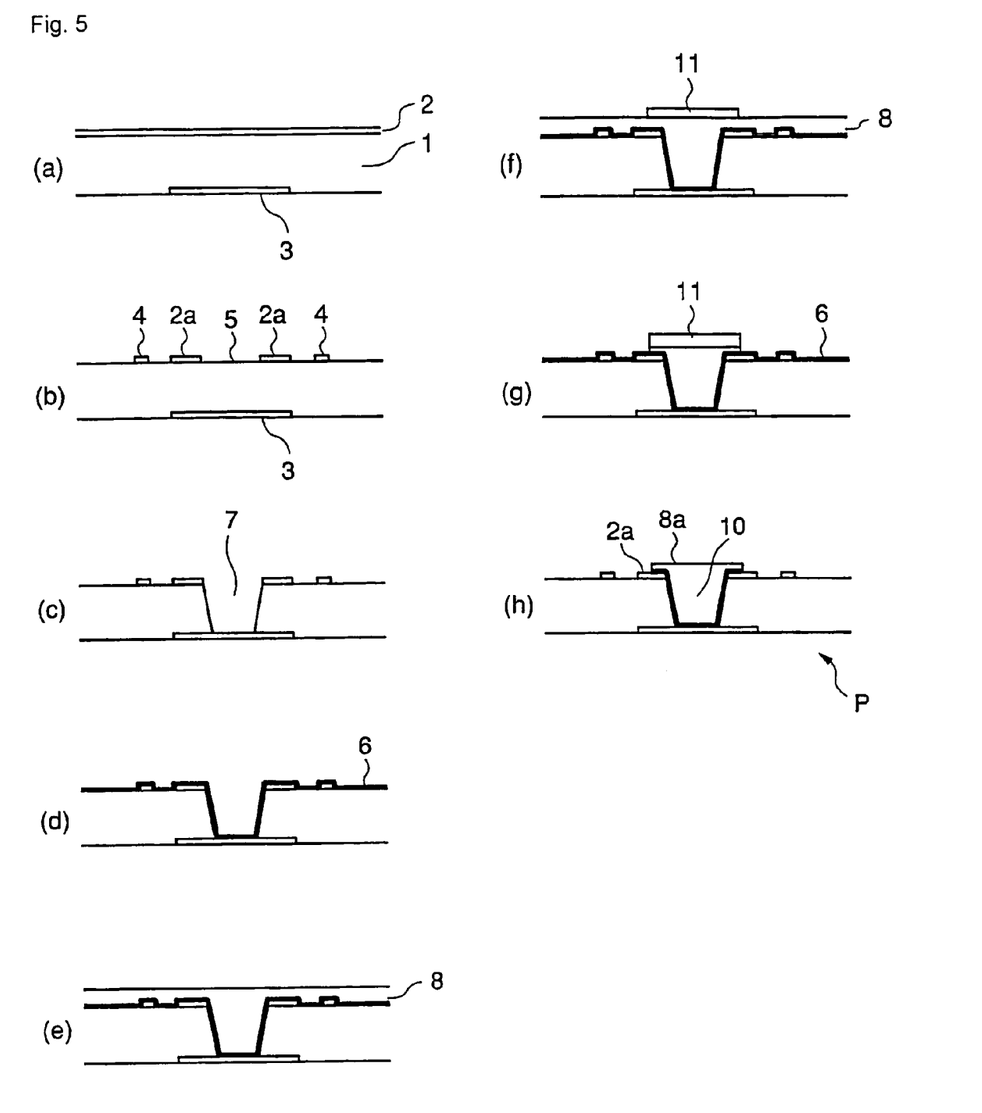
FIGS. 5(a) to 5(h) are each a schematic sectional diagram of steps to explain the fourth embodiment of the present invention.

After the formation of an upper-layer wiring pattern 4 (including also a metal foil land 2a) of FIG. 5(b), a non-electrolytic plating (for example, a nonelectrolytic copper plating) is deposited in the whole area of the outer layer including upper-layer wiring pattern 4 (including also a metal foil land 2a). Subsequently, a nonthrough hole 7 which reaches the lower-layer wiring pattern 3 is made by performing irradiation with a laser beam having a diameter larger than the diameter of the window portion 5 but smaller than the diameter of the metal foil land 2a by use of the metal foil land 2a as a mask for laser beam machining (refer to FIG. 5(c)).

Next, after the desmear treatment of the nonthrough hole 7 is performed, a nonelectrolytic plating (for example, a nonelectrolytic copper plating), which is not shown, is deposited in the whole area of the outer layer including the nonthrough hole 7. Subsequently, by performing electrolytic plating treatment using the nonelectrolytic plating as a power supply layer, a barrier metal layer 6 (for example, an electrolytic nickel plating) is deposited in whole area of the outer layer including the nonthrough hole 7 (refer to FIG. 5(d)).

Next, by performing electrolytic plating treatment (for example, electrolytic copper plating using a plating liquid for filled vias) using the barrier metal layer 6 as a power supply layer, a plating 8 is filled in the nonthrough hole 7 and the plating 8 is deposited also on the outer layer (refer to FIG. 5(e)).

Next, as shown in FIG. 5(f), an etching resist pattern 11 is formed in a portion where the blind via pattern 10 and its land portion (the later plating land 8a) are to be formed, and after that, by performing etching treatment, the plating 8 exposed from the etching resist pattern 11 is removed (refer to FIG. 5(g)).

And finally, after the exfoliation of the etching resist pattern 11, the barrier metal layer 6 exposed to the surface and a nonelectrolytic plating (for example, a nonelectrolytic copper plating) formed under the barrier metal layer 6 are removed, whereby a printed wiring board P of FIG. 5(h) is obtained (the nonelectrolytic plating formed under the barrier metal layer 6 can be simultaneously removed by an exfoliating liquid of the barrier metal layer 6 (for example, a nickel exfoliating liquid)).

Although the present invention has been described by using an example in which buildup layers are formed on a core substrate, the present invention is not limited to this construction and can also be applied to a double-sided wiring board.

Although a blind via hole to be formed has been described by using a filled via in which a plating is filled in a nonthrough hole, it is needless to say that the same effect can be obtained also from a usual blind via hole in which a plating is deposited on the inner wall of a nonthrough hole.

EXAMPLES

An embodiment of the present invention will be described with reference to FIGS. 5(l) to 5(h). Incidentally, a printed wiring board was fabricated in accordance with design specifications of line/space=30 µm/30 µm.

Resin-including copper foil constituted by an insulating layer having a thickness of 60 µm and copper foil having a thickness of 12 µm was laminated on a core substrate on which a lower-layer wiring pattern is formed (equivalent to FIG. 5(a)) and a dry film for etching resist (made by Asahi Kasei Corporation: SPG 102) was laminated.

Next, by performing usual exposure and development (a 1% sodium carbonate aqueous solution) and etching (etchant: use of ferric chloride), an upper-layer wiring pattern (line 30 µm/space 30 µm), a metal foil (copper foil) land (φ150 µm) and a window portion (φ70 µm) were respectively formed (equivalent to FIG. 5(b))

Next, in order to suppress the deterioration of a bath of desmear treatment liquid during later desmear treatment, a nonelectrolytic copper plating (0.5 µm) was deposited on the whole surface of an outer layer, and subsequently, a nonthrough hole which reaches the lower-layer wiring pattern was made by performing irradiation with a carbon dioxide gas laser beam having a diameter (φ110 µm→this size is such that extending off the metal foil land does not occur even if a positional deviation from the reference point in the range of 40 µm in diameter, which is the laser beam machining accuracy) larger than the diameter (φ170 µm) of the window portion but smaller than the diameter (φ150 µm) of the metal foil land by use of the metal foil land as a mask for laser beam machining (corresponding to FIG. 5(c)).

Next, the desmear treatment of the nonthrough hole was performed in a permanganate-based desmear treatment liquid and soft etching treatment was then performed as a pretreatment for nonelectrolytic copper plating (the nonelectrolytic copper plating deposited after the formation of the upper-layer wiring pattern is removed by this treatment). After that, a nonelectrolytic copper plating (0.5 µm) was deposited on the whole area of the outer layer including the nonthrough hole. Subsequently, by performing electrolytic nickel plating treatment using the nonelectolytic copper plating as a power supply layer, a barrier metal layer (1.5 µm) was deposited on the whole area of the outer layer including the nonthrough hole (equivalent to FIG. 5(d)).

Next, by performing electrolytic copper plating treatment (a plating liquid for filled vias was used as the plating liquid) using the barrier metal layer as a power supply layer, a copper plating was filled in the nonthrough hole and a copper plating (20 µm) was deposited also on the outer layer (equivalent to FIG. 5(e)).

Next, as shown in FIG. 5(f), in usual exposure and development steps an etching resist pattern of φ110 µm was formed in a portion where the blind via hole and its plating land portion are to be formed, and subsequently, by performing etching treatment in an alkaline etching liquid containing copper-ammonium complex ions as a main component, the plating exposed from the etching resist pattern was removed (equivalent to FIG. 5(g)).

And finally, after the exfoliation of the etching resist pattern in a sodium hydride aqueous solution (3%), the barrier metal layer exposed to the surface and a nonelectrolytic plating (for example, a nonelectrolytic copper plating) formed under the barrier metal layer were removed by etching treatment using an exfoliating liquid of the barrier metal layer (nickel) (a nitrate-based nickel exfoliating liquid), whereby a printed wiring board was obtained (equivalent to FIG. 5(h)).

The printed wiring board obtained in this embodiment was checked, and as a result, positional deviations, such as a plating land running off a metal foil land and exposure of a nonthrough hole, were not found.

A printed wiring board was fabricated by the manufacturing process of FIGS. 6(a) to 6(g), which is a conventional technique. Incidentally, laser beam machining conditions and exposure conditions were the same and, the diameter of a manufactured land and the like were also the same.

As a result, there were observed a place where a plating land runs off the outside diameter of a metal foil land by 20 µm or so and the space between adjacent wiring patterns becomes as close as 10 µm or, causing an insulation failure (because fabrication is performed in accordance with design specifications of line/space=30 µm/30 µm, the space between a metal foil land and an adjacent wiring pattern, which are formed by the same etching processing, becomes 30 µm, with the result that the space between the plating land running off the metal foil land by 20 µm or so and the wiring pattern becomes about 10 µm), and a place where a nonthrough hole is exposed (due to the positional deviation of an etching resist pattern) and the plating within a blind via hole is partially lost.

What is claimed is:

1. A method of manufacturing a printed wiring board in which wiring pattern forming layers are connected by a blind via hole, comprising the steps of:

forming at least a metal foil laminated on a surface of an insulating layer;

forming a wiring pattern and a land having a window portion inside, free of the metal foil, by etching the at least a metal foil;

irradiating the window portion with a laser beam having a diameter larger than a diameter of the window portion but smaller than a diameter of the land, thereby making a hole; and forming the blind via hole by forming a plating on the hole and the land.

2. The method of manufacturing a printed wiring board according to claim 1, further comprising:

after forming a wiring pattern, depositing a nonelectrolytic plating at least in a portion where the wiring pattern is not formed.

3. The method of manufacturing a printed wiring board according to claim 1 or 2, wherein the plating for the formation of the blind via hole is deposited also on wiring patterns having a size larger than 75 µm.

4. The method of manufacturing a printed wiring board according to claim 1, further comprising:

after the formation of a wiring pattern, forming a barrier metal layer having etching conditions different from etching conditions employed during the formation of the blind via hole at least on a front side surface of the wiring pattern.

* * * * *